United States Patent [19]

Kimura et al.

[11] 4,214,254
[45] Jul. 22, 1980

[54] AMPLIFIED GATE SEMICONDUCTOR CONTROLLED RECTIFIER WITH REDUCED LIFETIME IN AUXILIARY THYRISTOR PORTION

[75] Inventors: Shin Kimura; Hiroshi Fukui, both of Hitachi; Yoshio Terasawa, Katsuta, all of Japan

[73] Assignee: Hitachi, Ltd., Tokyo, Japan

[21] Appl. No.: 882,332

[22] Filed: Mar. 1, 1978

[30] Foreign Application Priority Data

Mar. 9, 1977 [JP] Japan .................................. 52-25580

[51] Int. Cl.$^2$ ............................................ H01L 29/74
[52] U.S. Cl. ...................................... 357/38; 357/20; 357/64; 357/86; 357/91
[58] Field of Search .................... 357/38, 64, 86, 20, 357/91

[56] References Cited

U.S. PATENT DOCUMENTS

| | | | |
|---|---|---|---|
| 3,408,545 | 10/1968 | De Cecco et al. | 357/38 |
| 3,526,815 | 9/1970 | Svedberg et al. | 357/38 |
| 4,056,408 | 11/1977 | Bartko et al. | 357/86 |
| 4,115,798 | 9/1978 | Platzoeder | 357/38 |

*Primary Examiner*—Joseph E. Clawson, Jr.
*Attorney, Agent, or Firm*—Craig & Antonelli

[57] ABSTRACT

A semiconductor controlled rectifier comprising an auxiliary thyristor region turned on by a gating signal and a main thyristor region turned on by being gated by the turn-on current flowing through the auxiliary thyristor region, wherein the life time of carriers in the auxiliary thyristor region is made shorter than that of the carriers in the main thyristor region.

10 Claims, 11 Drawing Figures

AMPLIFIED GATE SEMICONDUCTOR CONTROLLED RECTIFIER WITH REDUCED LIFETIME IN AUXILIARY THYRISTOR PORTION

BACKGROUND OF THE INVENTION

1. Field of the Invention

This invention relates to a semiconductor controlled rectifier having an amplifying type gate structure.

2. Description of the Prior Art

When a triggering voltage is applied between the gate and the cathode electrode of a semiconductor controlled rectifier, e.g. a thyristor, to cause a gate current to flow, with the forward voltage applied between the anode and the cathode thereof, the forward blocking PN junctions of the semiconductor controlled rectifier break over to cause a current to flow between the anode and the cathode. The change of the thyristor from its cut-off state to its conducting state is called the "turn-on" of the thyristor.

The turn-on of the thyristor begins with the turn-on of that small area of the thyristor which is on the periphery of the cathode and nearest to the gate electrode and the turned-on or conducting area expands up to the whole body of the thyristor. Accordingly, if the rate di/dt of rise of the forward current with time in the early stage of the turn-on operation has a great value, a high forward current will flow through a small conducting area to make the current density very high so that the power loss in that area may become so large as to destroy the thyristor in some extreme cases. In order to overcome such a drawback, a thyristor of amplifying gate type has been proposed which has an auxiliary thyristor region (U.S. Pat. No. 3,526,815). Such a thyristor has an auxiliary thyristor region and a main thyristor region formed integrally and parallel in the same semiconductor substrate, and the auxiliary thyristor region is first turned on by a triggering signal and the turn-on current, i.e. the current flowing through the auxiliary thyristor region, is used as a triggering signal for turning on the main thyristor region. Accordingly, the forward current in the early stage of the turn-on phenomenon divides into the main and auxiliary thyristor regions. Thus, the switching energy is shared to both the regions so that the di/dt capability in the early stage of turn-on can be considerably increased.

However, it has shown that the recently increasing demands for rectifiers having higher breakover voltage, greater current capacity and higher switching speeds necessitate further improvements in such an amplifying gate type thyristor. Namely, it has been revealed that if in this type of thyristor the main thyristor region is simply provided with an auxiliary thyristor region in the vicinity thereof, electric or thermal breakdown easily takes place in the auxiliary thyristor region and in its neighborhood and therefore that the di/dt capability cannot be sufficiently increased.

SUMMARY OF THE INVENTION

The object of this invention is to provide a semiconductor controlled rectifier having an improved amplifying gate structure, which can provide a sufficiently high di/dt capability.

One of the features of the semiconductor controlled rectifier according to this invention is embodied in a semiconductor controlled rectifier of amplifying gate type comprising an auxiliary thyristor region turned on by a gating signal and a main thyristor region turned on by being gated by the turn-on current flowing through the auxiliary thyristor region, characterized in that the life time of carriers in the auxiliary thyristor region is made shorter than that of the carriers in the main thyristor region. With this feature, the switching energy consumed in the auxiliary thyristor region where the turn-on area is apt to be locally concentrated, can be decreased so that the di/dt capability during the turn-on period can be considerably improved. To control the life time of the carriers in the auxiliary thyristor region, a method of doping life time killer material such as gold or platinum into the auxiliary thyristor region or a method of causing the use of electron rays, neutron rays or other radioactive rays, radiation damage which give rise to recombination centers for the carriers and other suitable methods may also be used. However, the method of radiation damage is preferable in view of the fact that the life time of the carriers in the auxiliary thyristor region having a small volume must be selectively controlled for high controllability and reproducibility.

DESCRIPTION OF THE PREFERRED EMBODIMENTS

Figure 1:
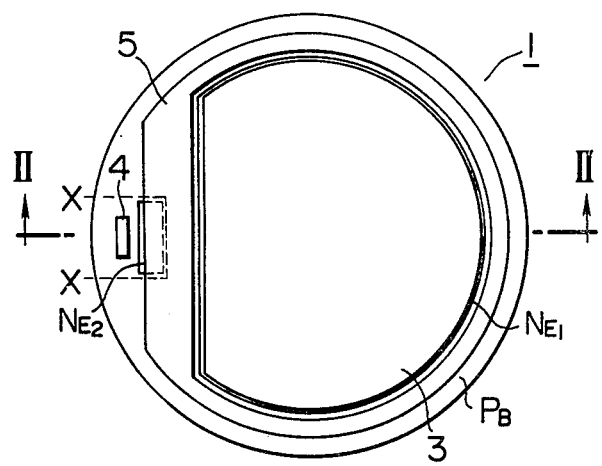
FIG. 1 schematically shows in plan a thyristor of amplifying gate structure as one embodiment of this invention.
Figure 2:
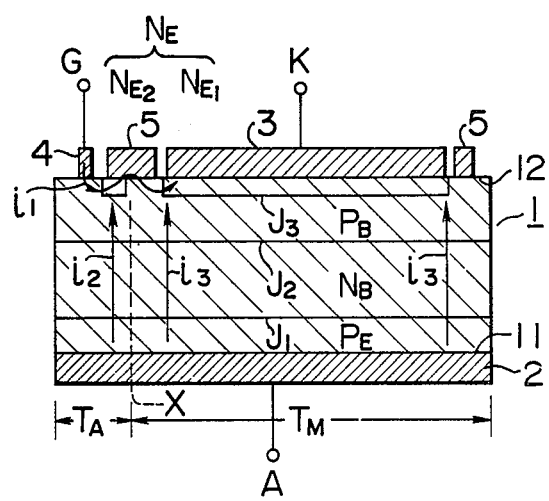
FIG. 2 is a cross section taken along line II—II in FIG. 1.

FIGS. 1 and 2 show in plan and cross section a thyristor having an amplifying gate structure. Shown in FIGS. 1 and 2 is a disc-shaped semiconductor substrate 1 of silicon with a pair of main surfaces 11 and 12 on the opposite sides consists of four semiconductor layers, i.e. P-type emitter layer $P_E$, N-type base layer $N_B$, P-type base layer $P_B$ and N-type emitter layer $N_E$. The N-type emitter layer $N_E$ consists of a main emitter region $N_{E1}$ and an auxiliary emitter region $N_{E2}$ isolated from the main emitter region $N_{E1}$ by the P-type base layer $P_B$ and having a smaller area than the region $N_{E1}$. The P-type emitter and N-type base layers $P_E$ and $N_B$ form a first PN junction $J_1$, the N-type base and P-type base layers $N_B$ and $P_B$ define a second PN junction $J_2$, and the P-type base and N-type emitter layers $P_B$ and $N_E$ create a third PN junction $J_3$. An anode electrode 2 placed on one main surface 11 of the silicon substrate 1 is in ohmic contact with the P-type emitter layer $P_E$ and a cathode electrode 3 placed on the other main surface 12 of the silicon substrate 1 is in ohmic contact with the main emitter region $N_{E1}$ of the N-type emitter layer $N_E$. A gate electrode 4 is provided on the main surface 12 in ohmic contact with the P-type base layer $P_B$, the gate electrode being located on the side opposite to the main emitter region $N_{E1}$ with respect to the auxiliary emitter region $N_{E2}$. An auxiliary gate electrode 5 provided on the main surface 12 of the silicon substrate 1, i.e. on the P-type base layer $P_B$, is separated from and surrounds the main emitter region $N_{E1}$. The auxiliary gate electrode 5 is in electrical contact with the surface of the auxiliary emitter region $N_{E2}$ on the side of the main emitter region $N_{E1}$. $T_M$ indicates a main thyristor region consisting of the parts of the four layers $P_E$, $N_B$, $P_B$ and $N_{E1}$ on the right hand side of the dashed line X in FIG. 2 while $T_A$ designates an auxiliary thyristor region consisting of the part of the four layers $P_E$, $N_B$, $P_B$ and $N_{E2}$ on the left hand side of the same dashed line X. The layers $P_E$, $N_B$ and $P_B$ are used in common by the main and auxiliary thyristor regions $T_M$ and $T_A$.

According to this invention, the life time of the carriers in the auxiliary thyristor region $T_A$ is made shorter than that of the carriers in the main thyristor region $T_M$. For example, the auxiliary thyristor region $T_A$ is selectively exposed to suitable radiation so as to cause radiation damage creating recombination centers.

The effect of decreasing the life time of the carriers in the auxiliary thyristor region $T_A$ will be described in detail below in conjunction with the thyristor described above.

If a trigger signal voltage is applied between the gate and the cathode electrodes 4 and 3, with a forward voltage applied between the anode and the cathode electrodes 2 and 3, then the gate current flows via the auxiliary emitter region $N_{E2}$, the auxiliary gate electrode 5, the main emitter region $N_{E1}$ and the cathode electrode 3, as indicated by an arrow $i_1$. In this case, since the density $J_A$ of the gate current flowing into the auxiliary emitter region $N_{E2}$ and the density $J_M$ of the gate current flowing into the main emitter region $N_{E1}$ are determined in such a manner that $J_A >> J_M$, then the auxiliary thyristor region $T_A$ is first turned on to cause a forward current to flow as indicated by an arrow $i_2$. Then, the larger area of the main thyristor region $T_M$ opposite to the auxiliary gate electrode 5 is turned on by the forward current to cause a forward current to flow as indicated by an arrow $i_3$. Thus, in the thyristor having an amplifying gate structure, the forward current in the early stage of the turn-on period is divided into two components flowing through the auxiliary thyristor region $T_A$ and the main thyristor region $T_M$, respectively. As a result, the switching energy is shared by the auxiliary and main thyristor regions $T_A$ and $T_M$ so that the di/dt capability can be relatively improved.

With a thyristor having an auxiliary thyristor region in which the life time of the carriers is not controlled according to this invention electric and thermal damage or breakdown tends to be easily caused in the auxiliary thyristor region and in the vicinity thereof so that the di/dt capability cannot be sufficiently increased. The reason for this is as follows. The di/dt capability of the thyristor having an amplifying gate structure is limited by the larger one of the switching energy consumed per initial conduction area of the auxiliary thyristor region $T_A$ and the switching energy consumed per the initial conduction area of the main thyristor region $T_A$. To increase the di/dt capability, therefore, the initial conduction areas of the auxiliary and main thyristors $T_A$ and $T_M$ must be increased in accordance with their corresponding energy consumptions. Since the main thyristor region $T_M$ uses as a gating current a large forward current (indicated by arrow $i_2$) flowing through the auxiliary thyristor region $T_A$, the initial conduction area can be easily increased by increasing the peripheral length of the main emitter $N_{E1}$ against the auxiliary electrode 5. As regards the auxiliary thyristor region $T_A$, however, if the peripheral length of the auxiliary emitter $N_{E2}$ against the gate electrode 4 is simply increased, a higher gating current is needed and in addition the initial conduction area can hardly be increased for the reason described below. Namely, in a thyristor with an amplifying gate structure, when the auxiliary thyristor region $T_A$ is turned on and the anode current ($i_2$ shown in FIG. 2) flows from the auxiliary gate electrode 5 to the cathode electrode 3, a voltage drop takes place between the auxiliary gate electrode 5 and the cathode electrode 3. As the voltage drop increases, the gate current ($i_1$ shown in FIG. 2) decreases and in some extreme cases the polarity of the gate current $i_1$ may be inverted. Accordingly, if the turn-on delay time is uneven in the auxiliary thyristor region $T_A$ opposite to the gate electrode 4 and turned on by the gate current $i_1$, no turn-on action due to the gate current takes place in the portions of the auxiliary thyristor region $T_A$ where the turning-on is to start with a delay, so that the overall initial conduction area cannot be increased. As the di/dt of the anode current increases, the voltage drop between the auxiliary gate electrode 5 and the cathode electrode 3 also increases to accelerate the decrease in the gate current so that the initial conduction area will be further decreased.

The forward current flowing through the auxiliary thyristor region $T_A$ and indicated by the arrows $i_2$ not only flows before and at the time of the turn-on of the main thyristor region $T_M$ but also continues to flow as a component $i_3$ of the anode current ($i_2+i_3$) after the main thyristor region $T_M$ has been turned conductive. As a result, if the di/dt of the anode current increases, the component indicated by the arrow $i_2$, i.e. the forward current also increases. Consequently, the greatest switching energy consumed per initial conduction area is in the auxiliary thyristor region whose initial conduction area is hardly increased. Further, since the forward current indicated by the arrow $i_2$ flows through that portion of the P-type base layer $P_B$ which is between the auxiliary gate electrode 5 and the cathode electrode 3 and also flows in the lateral direction along the main emitter region $N_{E1}$, then the heat generated due to the increased forward current ($i_2$) is not negligible.

As described above, with a thyristor having an amplifying gate structure in which the life time of carriers in the auxiliary thyristor region is not appropriately controlled, the increase in the di/dt of the anode current is accompanied with the increase in the forward current flowing through the auxiliary thyristor region $T_A$ and indicated by the arrow $i_2$ so that electric and thermal damage or breakdown tends to easily take place.

The thyristor embodying this invention can provide a sufficiently large di/dt capability during the turn-on period and yet be free from the above described problem. The reason for this is as follows.

Figure 3:
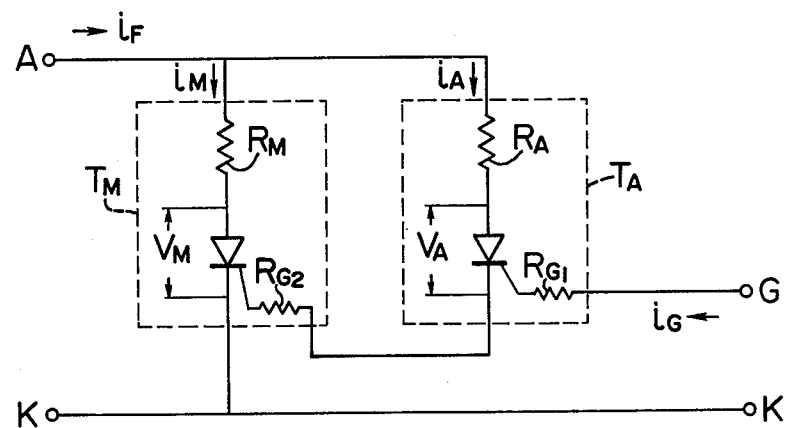
FIG. 3 is an equivalent circuit for a thyristor of amplifying gate type, which serves to clarify the spirit of this invention.

FIG. 3 is an equivalent circuit for the thyristor having an amplifying gate structure, shown in FIGS. 1 and 2. In FIG. 3, $R_{G1}$ indicates the resistance of that portion of the P-type base layer $P_B$ which is between the gate electrode 4 and the auxiliary emitter region $N_{E2}$ and $R_{G2}$ the resistance of that portion of the layer $P_B$ which lies between the auxiliary gate electrode 5 and the main emitter region $N_{E1}$. $R_A$ and $V_A$ designate the resistance and the voltage components of the auxiliary thyristor region $T_A$ in the early stage of the turn-on period. The resistance component $R_A$ is the component varied in accordance with the quantity of the carriers in the N-type base layer $N_B$ which increases when the gate current $i_G$ and the forward current $i_A$ flow into the auxiliary thyristor region $T_A$. The voltage component $V_A$ is the component invariable under the influence of the gate current $i_G$ and the forward current $i_A$. Similarly, the main thyristor region $T_M$ may be represented in terms of the resistance and the voltage components $R_M$ and $V_M$.

The inventors' experiments and researches have revealed that the resistance components $R_A$ and $R_M$ of the auxiliary and main thyristor regions $T_A$ and $T_M$ vary in accordance with the quantity of the carriers in the N-type base layer $N_B$ which increases in proportion to the integrated values of the gate and the forward current $i_G$ and $i_A$ and that they are approximately given by the following expressions.

$$R_A \propto \frac{K_1}{\int i_G dt + \int i_A dt} \quad (1)$$

$$R_M \propto \frac{K_2}{\int i_G dt + \int i_A dt + \int i_m dt} \quad (2)$$

where $K_1$ and $K_2$ are proportional constants varying in accordance with the life times of the carriers in the N-type base and P-type base layers $N_B$ and $P_B$, respectively. If the life times of the carriers are short, the quantity of the carriers accumulated in the N-type base layer $N_B$ is small so that the proportional constants $K_1$ and $K_2$ become large.

By substituting the values of the proportional constants $K_1$ and $K_2$ and other required pieces of information into the expressions (1) and (2) and therefore by calculating the values of currents at various points in the equivalent circuit in FIG. 3, it is clarified that as the life time $\tau_{NB}$ of the carriers in the N-type base layer $N_B$ of the auxiliary thyristor region $T_A$ is made shorter than the corresponding life time $\tau_{NB}$ of the main thyristor region $T_M$, the current $i_A$ flowing through the auxiliary thyristor region $T_A$ becomes smaller. Moreover, the forward current $i_A$ can also be decreased by increasing the resistance $R_{G2}$ of the P-type base layer $P_B$ between the main emitter region $N_{E1}$ and the auxiliary gate electrode 5 but in this case the effect of decreasing the forward current $i_A$ cannot be satisfactory since the gate structure limits the increase in the resistance $R_{G2}$.

Figure 4:
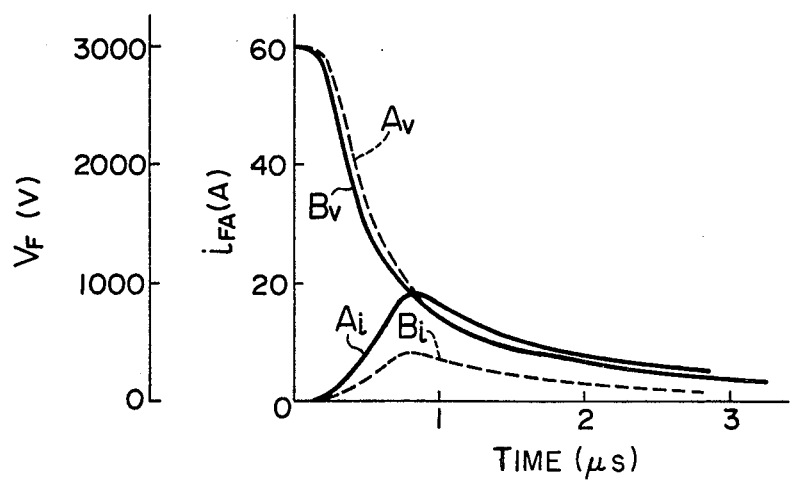
FIG. 4 comparatively shows the forward voltage and current waveform in the early stage of turn-on period, of the conventional thyristor and a thyristor embodying this invention.
Figure 5:
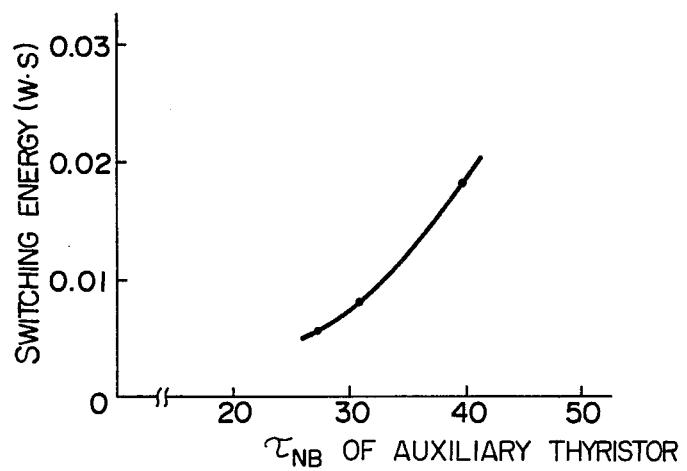
FIG. 5 shows the relationship between the life time of the carriers in the N base layer of the auxiliary thyristor region and the switching energy.

Next, the experimental results which assure the usefulness of this invention will be described. In a thyristor having an amplifying gate structure, the currents $i_A$ and $i_M$ flowing respectively through the auxiliary and main thyristor regions $T_A$ and $T_M$ cannot be separately measured. Accordingly, two thyristors each having an amplifying gate structure are used and the auxiliary gate electrodes of the two thyristors are short-circuited in turn. By combining the auxiliary thyristor region of one thyristor with the main thyristor region of the other thyristor, the currents $i_A$ and $i_M$ flowing through the auxiliary and main thyristors $T_A$ and $T_M$, and the forward voltage $V_F$ across the main thyristor region $T_M$ are measured. The result of the measurement is as shown in FIG. 4. In FIG. 4, curves $A_V$ and $B_V$ represent the waveforms of the forward voltage $V_F$ and curves $A_i$ and $B_i$ the waveforms of the forward current $i_F$. The curves $A_V$ and $A_i$ correspond to the case where the life times $\tau_{NB}$ of carriers in the N-type base layer $N_B$ in both the main and auxiliary thyristor regions $T_M$ and $T_A$ equal 40 $\mu$s and the curves $B_V$ and $B_i$ to the case where the life time $\tau_{NB}$ of the main thyristor region $T_M$ is 40 $\mu$s while the life time $\tau_{NB}$ of the auxiliary thyristor region $T_A$ is 31 $\mu$s. According to FIG. 4, therefore, it is clear that the forward current $i_A$ flowing through the auxiliary thyristor region $T_A$ can be decreased if the life time of the carriers in the auxiliary thyristor region $T_A$ is made shorter than the life time of the carriers in the main thyristor region $T_M$.

As described above, according to the thyristor embodying this invention, the switching energy consumed in the auxiliary thyristor region $T_A$ where the initially conducting, i.e. turn-on domain tends to be localized can be decreased. Consequently, the switching energy consumed in the main thyristor region $T_M$ increases, but since the conducting domain of the main thyristor region $T_M$ in the early stage of the turn-on period is very large due to the elongation of the peripheral length of the main emitter region $N_{E1}$ against the auxiliary gate electrode 5, the rate of increase in the switching energy consumed in the main thyristor region $T_M$ can be limited to a small value. As a result, the di/dt capability in an amplifying gate type thyristor can be improved from the conventional value of 300 A/$\mu$s up to higher than 600 A/$\mu$s.

In the above embodiment shown in FIGS. 1 and 2, the life time of the carriers in the auxiliary thyristor region on the left hand side of the dashed line X in FIGS. 1 and 2 is shortened, but it is preferable that the life time of the carriers in that portion of the substrate which registers on the projection of the auxiliary emitter region $N_{E2}$ in the direction perpendicular to the main surface 12 and the life time of the carriers in the vicinity of that portion (within 3 times the diffusion length of the carriers) should be made shorter than the life time of the carriers in the main thyristor region. The term "vicinity" used here means the region within the distance equal to three times the diffusion length of the carriers, measured parallel to the main surface 12 from the border of the above defined portion. This region is thus confined within a boundary beyond which the accumulation of electric charges during the conduction of the auxiliary thyristor region becomes extremely small. These conditions should be retained also in the following modified embodiments.

This invention is by no means limited to the embodiment shown in FIGS. 1 and 2, but permits of the following variations shown in FIGS. 6A, 6B to 8A, 8B. In these figures, the same reference numerals are applied to like parts in FIGS. 1 and 2.

Figure 6A:
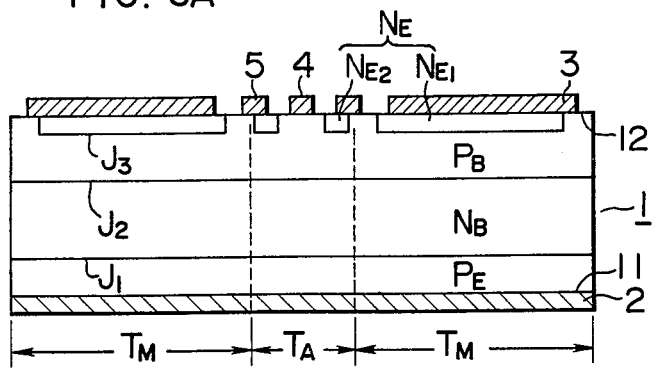
FIGS. 6A, 7A and 8A are sectional views of various modifications of the embodiment according to the present invention
Figure 6B:
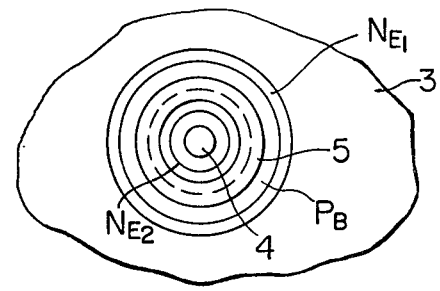
FIGS. 6B, 7B and 8B are respective partial plan views thereof.

(1) The gate electrode 4 is disposed in the center of the semiconductor substrate 1 and the auxiliary and main emitter regions $N_{E2}$ and $N_{E1}$ are formed in the shape of a ring around the gate electrode 4 (FIGS. 6A, 6B).

Figure 7A:
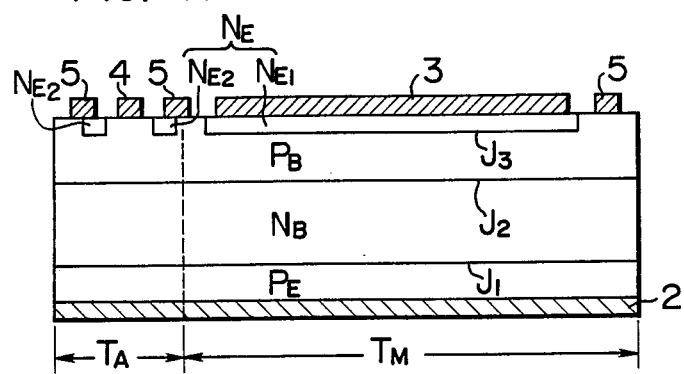
Figure 7B:
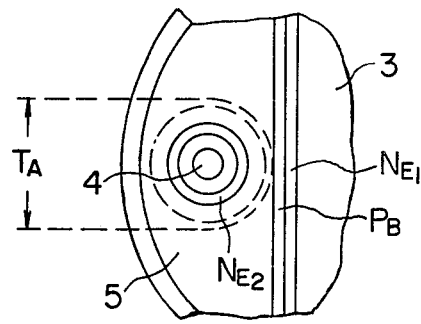

(2) The auxiliary thyristor region $T_A$ is arranged in the peripheral portion of the substrate 1 and the auxiliary emitter region $N_{E2}$ is formed in the shape of a ring circling the gate electrode 4 (FIGS. 7A, 7B).

Figure 8A:
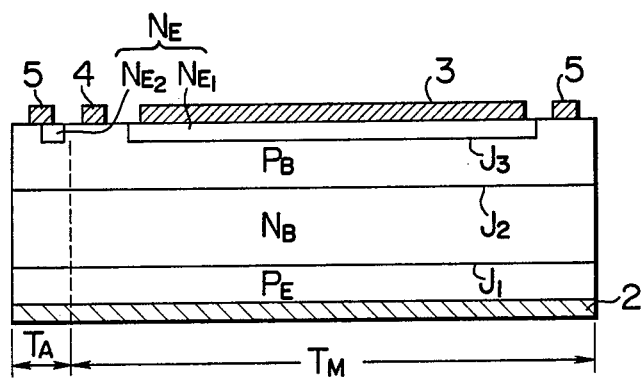
Figure 8B:
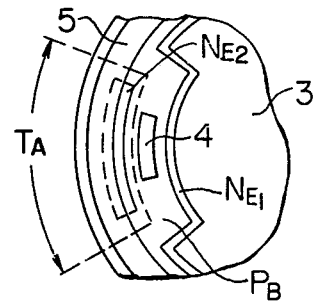

(3) The gate electrode 4 is in contact with the portion of the P-type base layer $P_B$ between the main and auxiliary emitter regions $N_{E1}$ and $N_{E2}$ (FIGS. 8A, 8B).

(4) In the thyristor shown in FIG. 1, 7A, 7B or 8A, 8B, the auxiliary gate electrode 5 is not ring-shaped, but extended along a portion of the periphery of the main emitter region $N_{E1}$.

What is claimed is:

1. A semiconductor rectifier comprising
a semiconductor substrate having a pair of main surfaces and consisting of four alternate P-type and N-type layers continuously formed between said pair of main surfaces, any contiguous layers defining a PN junction between them, one of said main surfaces consisting of exposed surfaces of one outermost layer and one intermediate layer and the other main surface being the exposed surface of the other outermost layer, and said one outermost layer consisting of a main region and an auxiliary region having a smaller area than said main region and separated from said main region by said one intermediate layer;
a first main electrode disposed on said one main surface of said semiconductor substrate and kept in ohmic contact with said main region;
a second main electrode disposed on said other main surface of said semiconductor substrate and kept in ohmic contact with said other outermost layer;
a gate electrode disposed on said one main surface of said semiconductor substrate and kept in ohmic contact with the portion of said one intermediate layer in the neighborhood of said auxiliary region; and
an auxiliary gate electrode disposed on said one main surface of said semiconductor substrate, extended on said one intermediate layer along the periphery of said main region and having its portion in ohmic contact with said auxiliary region, wherein the life time of the carriers in a first portion of said substrate which registers on the projection of said auxiliary region in the direction perpendicular to said one main surface and the life time of the carriers in a second portion of said substrate in the vicinity of said first portion are made shorter than the life time of the carriers in a third portion of said substrate which registers on a similar projection of said main region.

2. A semiconductor controlled rectifier as claimed in claim 1, wherein said first portion of said substrate registering on the projection of said auxiliary region in the direction perpendicular to said one main surface and said second portion of said substrate in the vicinity of said first portion are doped with a first life time killer material concentrate in a concentration higher than a second life time killer material concentrate which is doped in said third portion of said substrate registering on a similar projection of said main region.

3. A semiconductor controlled rectifier as claimed in claim 2, wherein said auxiliary region is formed between said main region and said gate electrode.

4. A semiconductor controlled rectifier as claimed in claim 2, wherein said gate electrode is formed between said main region and said auxiliary region.

5. A semiconductor controlled rectifier as claimed in claim 2, wherein said main region is so formed as to surround said auxiliary region and said auxiliary region is so formed as to surround the contact portion of said gate electrode.

6. A semiconductor controlled rectifier as claimed in claim 1, wherein said first portion of said substrate registering on the projection of said auxiliary region in the direction perpendicular to said one main surface and in said second portion of said substrate in the vicinity of said first portion have concentrations of recombination centers generated through the irradiation of radioactive rays which concentrations are higher than the concentration of recombination centers generated through the same process in said third portion of said substrate registering on a similar projection of said main region.

7. A semiconductor controlled rectifier as claimed in claim 6, wherein said auxiliary region is formed between said main region and said gate electrode.

8. A semiconductor controlled rectifier as claimed in claim 6, wherein said gate electrode is disposed between said main region and said auxiliary region.

9. A semiconductor controlled rectifier as claimed in claim 6, wherein said main region is so formed as to surround said auxiliary region and said auxiliary region is so formed as to surround the contact portion of said gate electrode.

10. A semiconductor controlled rectifier comprising
a first semiconductor substrate portion consisting of four alternate P-type and N-type layers continuously formed;
a second semiconductor substrate portion consisting of four alternate P-type and N-type layers continuously formed;
a first main electrode in ohmic contact with the outermost N-type layer of said first semiconductor substrate portion;
a second main electrode in ohmic contact with the outermost P-type layers of said first and second semiconductor substrate portions;
a first auxiliary electrode in ohmic contact with the intermediate P-type layer of said second semiconductor substrate portion; and
a second auxiliary electrode in ohmic contact with the intermediate P-type layer of said first semiconductor substrate portion and the outermost N-type layer of said second semiconductor substrate portion, wherein said second semiconductor substrate portion has a smaller current conduction area and a shorter carrier life time than that of said first semiconductor substrate portion.

* * * * *